United States Patent
Singer (10) Patent No.: US 9,425,331 B2
(45) Date of Patent: Aug. 23, 2016

(54) SOLAR CELL WAFER CONNECTING SYSTEM

(71) Applicant: The Boeing Company, Chicago, IL (US)

(72) Inventor: Scott Benjamin Singer, Sherman Oaks, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/452,934

(22) Filed: Aug. 6, 2014

(65) Prior Publication Data

US 2016/0043241 A1    Feb. 11, 2016

(51) Int. Cl.
| | | |
|---|---|---|
| *H01L 31/02* | (2006.01) | |
| *H01L 31/0352* | (2006.01) | |
| *H01L 31/0725* | (2012.01) | |
| *H01L 31/078* | (2012.01) | |
| *H01L 31/18* | (2006.01) | |
| *H01L 31/043* | (2014.01) | |

(52) U.S. Cl.
CPC . *H01L 31/02008* (2013.01); *H01L 31/035227* (2013.01); *H01L 31/043* (2014.12); *H01L 31/078* (2013.01); *H01L 31/0725* (2013.01); *H01L 31/1892* (2013.01)

(58) Field of Classification Search
CPC ........... H01L 29/0669; H01L 29/1606; H01L 51/447; H01L 21/02603; H01L 31/02008; H01L 31/043; H01L 31/1892; H01L 31/0725; H01L 31/078; H01L 31/035227
See application file for complete search history.

(56) References Cited

U.S. PATENT DOCUMENTS

| | | | |
|---|---|---|---|
| 5,783,477 A | 7/1998 | Kish et al. | |
| 7,785,989 B2 | 8/2010 | Sharps et al. | |
| 8,993,879 B2 * | 3/2015 | Boca | H01L 21/2007 136/252 |
| 2008/0066802 A1 * | 3/2008 | Reddy | B82Y 10/00 136/258 |
| 2008/0178924 A1 * | 7/2008 | Kempa | B82Y 10/00 136/244 |
| 2008/0211112 A1 | 9/2008 | Wyland | |
| 2011/0303288 A1 * | 12/2011 | Boca | H01L 21/2007 136/261 |
| 2012/0321961 A1 | 12/2012 | Yushin et al. | |
| 2013/0056145 A1 | 3/2013 | Fisher et al. | |

FOREIGN PATENT DOCUMENTS

| | | |
|---|---|---|
| DE | 102006037198 A1 | 2/2008 |
| WO | WO2011129548 A2 | 10/2011 |

OTHER PUBLICATIONS

Duda et al., "Inverted Metamorphic Multijunction (IMM) Cell Processing Instructions," National Renewable Energy Laboratory (NREL), Technical Report, NREL/TP-5200-54049, Feb. 2012, 9 pages.

(Continued)

*Primary Examiner* — Roy Potter
(74) *Attorney, Agent, or Firm* — Yee & Associates, P.C.

(57) ABSTRACT

A method and apparatus for forming a solar cell structure. A first wafer and a second wafer are positioned relative to each other such that first nanotubes on the first wafer are opposite to second nanotubes on the second wafer. The first nanotubes are connected to the second nanotubes. The first wafer is connected to the second wafer to form the solar cell structure.

18 Claims, 8 Drawing Sheets

(56) References Cited

OTHER PUBLICATIONS

Extended European Search Report, dated Feb. 9, 2016, regarding Application No. EP15172584.3, 5 pages.

Boca et al., "Carbon nanotube-composite wafer bonding for ultra-high efficiency III-V multijuncfion solar cells," 2010 35th IEEE Photovoltaic Specialists Conference, Jun. 1, 2010, pp. 003310-003315.

\* cited by examiner

SOLAR CELL WAFER CONNECTING SYSTEM

BACKGROUND INFORMATION

1. Field

The present disclosure relates generally to solar cells and, in particular, to forming solar cells that have multiple junctions. Sill more particularly, the present disclosure relates to a method and apparatus for connecting wafers to each other to form solar cell structures.

2. Background

A solar cell is a device that converts energy in light into electricity using a photovoltaic effect. In manufacturing solar cells, it is desirable to increase the efficiency at which solar cells generate electricity from light. Traditional single junction cells have a maximum theoretical efficiency of about 34 percent.

With multiple junctions, solar cells may have increased efficiency. Multiple junctions may be formed by manufacturing the solar cell with multiple subcells connected by junctions, in which each junction generates electricity from a particular wavelength or range of wavelengths of light passed by a subcell.

A multi-junction solar cell may be manufactured by layering different materials on top of each other. The materials may be selected to pass different wavelengths at the different layers in the solar cell.

Manufacturing multi-junction solar cells may involve manufacturing the different layers onto one or more wafers. These wafers are connected to each other to form the multi-junction solar cell. In particular, the wafers are bonded to each other.

One example of a multi-junction solar cell that may involve bonding wafers together is an inverted metamorphic multi-junction (IMM) solar cell. With this type of cell, dissimilar wafers are bonded to each other. Dissimilar wafers are wafers that have different materials from each other. As a result, the lattices of atoms may pull each other because of these differences.

However, direct bonding of these types of wafers may result in undesired inconsistencies. For example, cracks, delamination, or other undesired themes may occur at these temperatures and pressures in which direct bonding occurs.

Therefore, it would be desirable to have a method and apparatus that take into account at least some of the issues discussed above, as well as other possible issues. For example, it would be desirable to have a method that bonds wafers that are dissimilar to each other in a manner that avoids issues associated with the high temperatures that may lead to cracking, delamination, or other undesired inconsistencies in the wafers.

SUMMARY

In one illustrative embodiment, a method for forming a solar cell structure is provided. A first wafer and a second wafer are positioned relative to each other such that first nanotubes on the first wafer are opposite to second nanotubes on the second wafer. The first nanotubes are connected to the second nanotubes. The first wafer is connected to the second wafer to form the solar cell structure.

In another illustrative embodiment, a solar cell structure comprises a first wafer, a second wafer, first nanotubes formed on the first wafer, and second nanotubes formed on the second wafer.

In yet another illustrative embodiment, a method for forming a structure is presented. A first wafer and a second wafer are positioned relative to each other such that first nanotubes on the first wafer are opposite to second nanotubes on the second wafer. The first nanotubes are connected to the second nanotubes. The first wafer is connected to the second wafer to form the structure.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account that other types of techniques are present for bonding wafers to each other that may be used in place of direct bonding. For example, another type of bonding that is metal-eutectic bonding may be used with wafers having dissimilar materials. With this type of bonding, an intermediate material is deposited on one or both surfaces of the wafers to be bonded to each other. This material may be, for example, a solder or metal. This type of bonding involves temperature and heat. Another alternative is bonding using adhesives. Adhesives may be used to bond wafers using temperatures that are lower than metal-eutectic bonding.

The illustrative embodiments recognize and take into account that when connecting dissimilar wafers to each other to form solar cell structures, it is often desirable to have a connection that provides for a desired level of transparency to pass light and conductivity. The transparency allows the light to pass from one subcell in one wafer to another subcell in another wafer. The conductivity allows for a current that may be generated by a junction to pass between the wafers.

The illustrative embodiments recognize and take into account that metal-eutectic bonding provides connectivity, solder or metal, but does not have the transparency needed to pass a desired amount of light. The illustrative embodiments also recognize and take into account that adhesives can pass light, but are not conductive.

Thus, the illustrative embodiments provide a method and apparatus for a solar cell connecting system. In one illustrative embodiment, a method for forming a solar cell structure is presented. A first wafer and a second wafer are positioned relative to each other such that first nanotubes on the first wafer are opposite to second nanotubes on the second wafer. The first nanotubes are connected to the second nanotubes. The first wafer is connected to the second wafer to form the solar cell structure.

Figure 1:
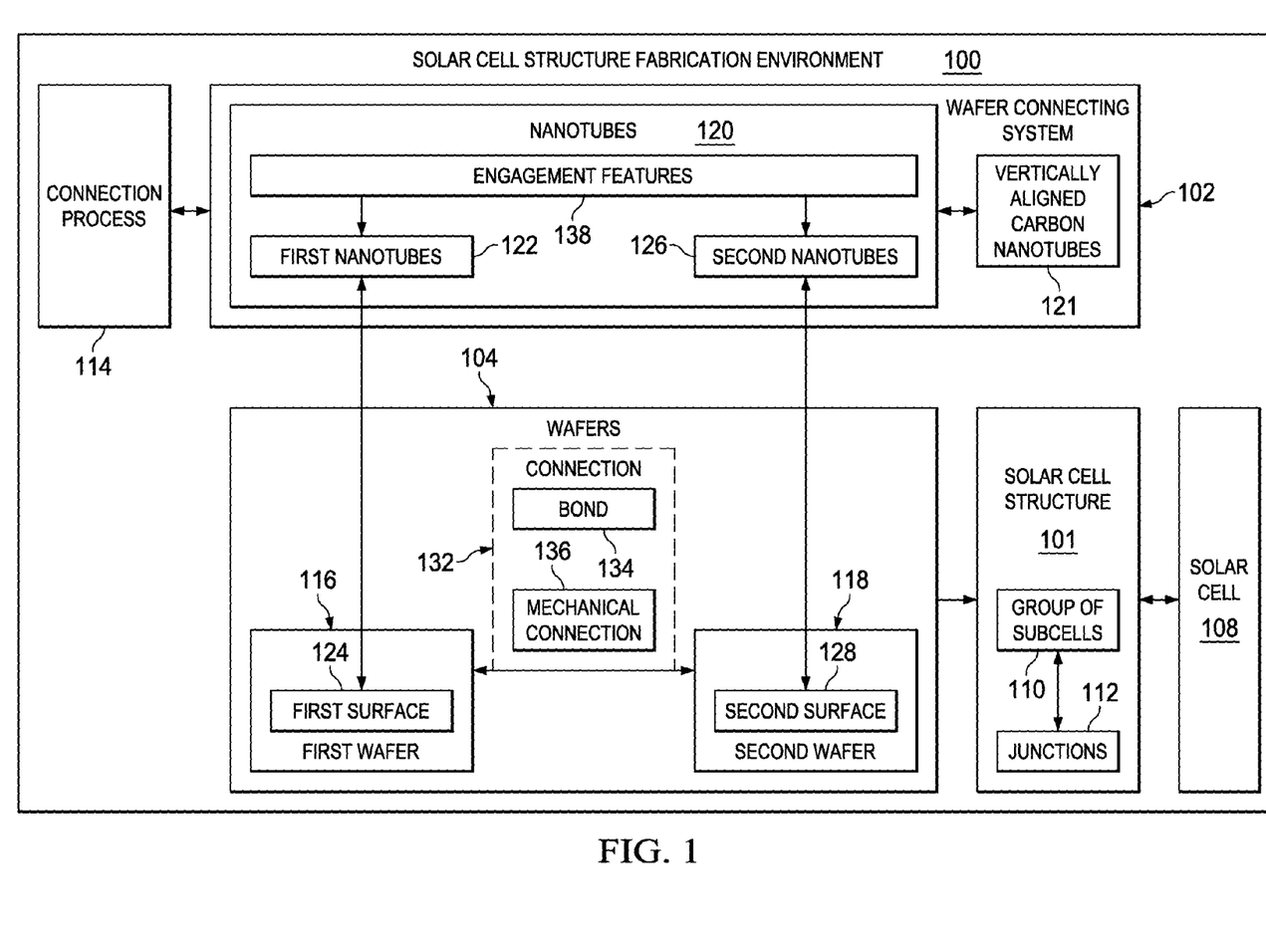
FIG. 1 is an illustration of a solar cell fabrication environment in the form of a block diagram in accordance with an illustrative embodiment.

With reference now to the figures and with reference to FIG. 1, an illustration of a solar cell fabrication environment in the form of a block diagram is depicted in accordance with an illustrative embodiment. As depicted, solar cell structure fabrication environment 100 manufactures solar cell structure 101 using wafer connecting system 102. In this illustrative example, wafer connecting system 102 is used to connect wafers 104 to form solar cell structure 101.

As depicted, solar cell structure 101 may be solar cell 108 or may be part of solar cell 108. In particular, solar cell 108 may be an inverted metamorphic multi-junction solar cell in the illustrative example.

In this example, solar cell 108 has a group of subcells 110 with a group of junctions 112 between the group of subcells 110. As used herein, "a group of," when used with reference to items means one or more items. For example, a group of junctions 112 is one or more of junctions 112.

In this illustrative example, connection process 114 is used to connect first wafer 116 in wafers 104 and second wafer 118 in wafers 104 to each other with wafer connecting system 102. As depicted, first wafer 116 may be selected from one of a similar wafer and a dissimilar wafer from second wafer 118. Also, first wafer 116 may have a first group of subcells and second wafer 118 may have at least one of a second group subcells or a handle.

In this illustrative example, wafer connecting system 102 comprises nanotubes 120. In particular, nanotubes 120 are vertically aligned carbon nanotubes (VACNT) 121. As depicted, a nanotube in nanotubes 120 is a cylindrical carbon structure.

For example, a nanotube may be formed from hexagonal graphite molecules attached at the edges. A nanotube may be rolled up sheets of graphene that form hollow strands with walls that are about one atom thick. A nanotube may have a single wall or may have multiple walls.

In the illustrative example, first nanotubes 122 in nanotubes 120 are formed on first surface 124 of first wafer 116. Second nanotubes 126 in nanotubes 120 are formed on second surface 128 of second wafer 118. In this example, first nanotubes 122 and second nanotubes 126 may each have a diameter from about 2 nanometers to about 50 nanometers and a length from about 2 microns to about 10 microns.

As depicted, first nanotubes 122 extend in a direction substantially perpendicular to first surface 124 of first wafer 116. Second nanotubes 126 extend in a direction substantially perpendicular to second surface 128 of second wafer 118. In this manner, first nanotubes 122 and second nanotubes 126 are vertically aligned carbon nanotubes 121.

As depicted, connection 132 between first wafer 116 and second wafer 118 is formed using first nanotubes 122 and second nanotubes 126. In these illustrative examples, first wafer 116 and second wafer 118 are positioned relative to each other such that first nanotubes 122 on first wafer 116 are opposite to second nanotubes 126 on second wafer 118. First wafer 116 and second wafer 118 are moved towards each other and pressure may be applied to form connection 132 between first nanotubes 122 and second nanotubes 126.

As depicted, connection 132 does not need to be made at temperatures used for direct bonding. Instead, connection 132 between first nanotubes 122 and second nanotubes 126 may be made at ambient temperatures in solar cell structure fabrication environment 100. In other words, connection 132 may be performed using room temperature or other desired temperatures.

In this illustrative example, connection 132 may take one or more different forms. For example, connection 132 may be at least one of bond 134 or mechanical connection 136. As used herein, the phrase "at least one of," when used with a list of items, means different combinations of one or more of the listed items may be used and only one of each item in the list may be needed. In other words, at least one of means any combination of items and number of items may be used from the list but not all of the items in the list are required. The item may be a particular object, thing, or a category.

For example, without limitation, "at least one of item A, item B, or item C" may include item A, item A and item B, or item B. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

For example, bond 134 is based on van der Waals forces between first nanotubes 122 and second nanotubes 126. Bond 134 may occur when first nanotubes 122 and second nanotubes 126 engage each other as first wafer 116 is moved towards second wafer 118 or both first wafer 116 and second wafer 118 are moved towards each other in one illustrative example.

As depicted, mechanical connection 136 is between first nanotubes 122 and second nanotubes 126. Mechanical connection 136 may occur through the use of engagement features 138 on first nanotubes 122 and second nanotubes 126. The engagement features may be, for example, different shapes for the ends of first nanotubes 122 and second nanotubes 126. The shapes may include, for example, at least one of a hook shape, a loop shape, a corkscrew shape, or a tapered shape.

In this manner, wafer connecting system 102 provides a desired level of mechanical interaction through engagement features 138 between first nanotubes 122 and second nanotubes 126 that form mechanical connection 136. Additionally, bond 134 may be formed in addition to or in place of mechanical connection 136. Further, the use of carbon nanotubes for nanotubes 120 provides a desired level of transparency and electrical conductivity. In these illustrative examples, the perpendicular alignment of nanotubes 120 on wafers 104 provides a desired level of optical transparency for light incident along the axis extending through nanotubes 120. Additionally, chirality may be controlled for nanotubes 120 during formation of nanotubes 120 for added transparency of nanotubes 120.

Additionally, the formation of connection 132 between first nanotubes 122 and second nanotubes 126 may be performed at temperatures that do not result in undesired inconsistencies in first wafer 116 and second wafer 118 in forming solar cell structure 101. Without the need for higher temperatures such as those used in direct bonding of wafers, a reduction in the cost for equipment and maintenance also may occur. Further, with the reduction in processing temperatures, the yield of solar cell structures may increase with respect to the number of wafers 104 used through connection process 114 without requiring rework or replacement.

The illustration of solar cell structure fabrication environment 100 in FIG. 1 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

Figure 2:
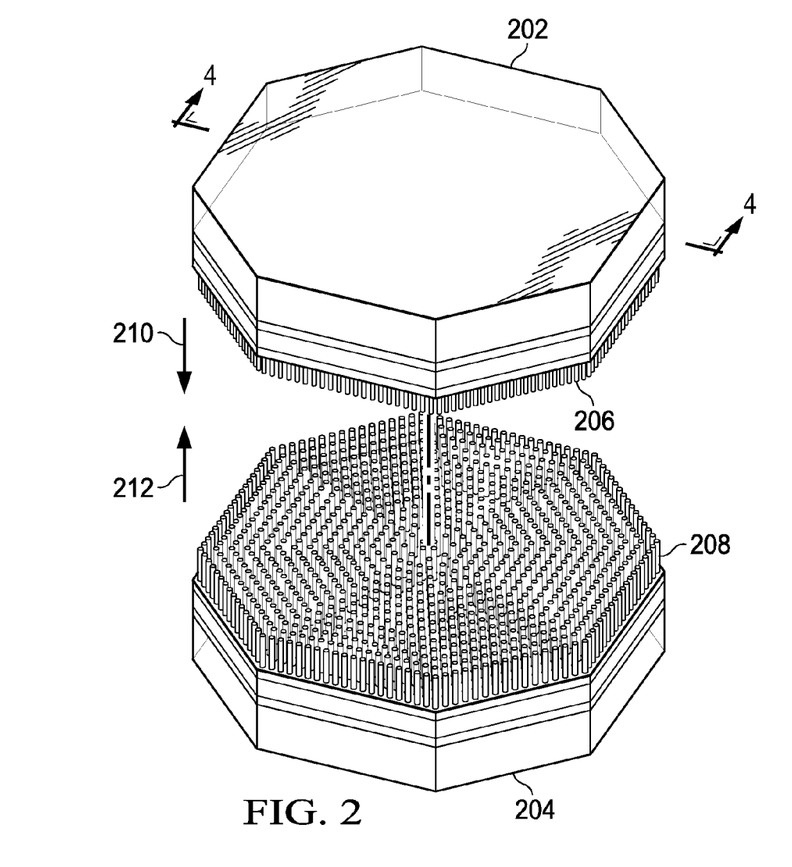
FIG. 2 is an illustration of wafers for a solar cell structure in accordance with an illustrative embodiment.

With reference now to FIG. 2, an illustration of wafers for a solar cell structure is depicted in accordance with an illustrative embodiment. In this illustrative example, a perspective view of first wafer 202 and second wafer 204 are shown. First wafer 202 is an example of a physical implementation of first wafer 116 shown in block form in FIG. 1, and second wafer 204 is an example of a physical implementation of second wafer 118 shown in block form in FIG. 1.

First wafer 202 and second wafer 204 are positioned with respect to each other for connection to form a solar cell structure. In this illustrative example, first nanotubes 206 are present on first wafer 202 and second nanotubes 208 are present on second wafer 204.

As depicted, first wafer 202 may be moved in the direction of arrow 210 toward second wafer 204 such that first nanotubes 206 engage second nanotubes 208. In another illustrative example, second wafer 204 may be moved in the direction of arrow 212 such that second nanotubes 208 engage first nanotubes 206. In another illustration example, both first wafer 202 and second wafer 204 are moved towards each other.

Figure 3:
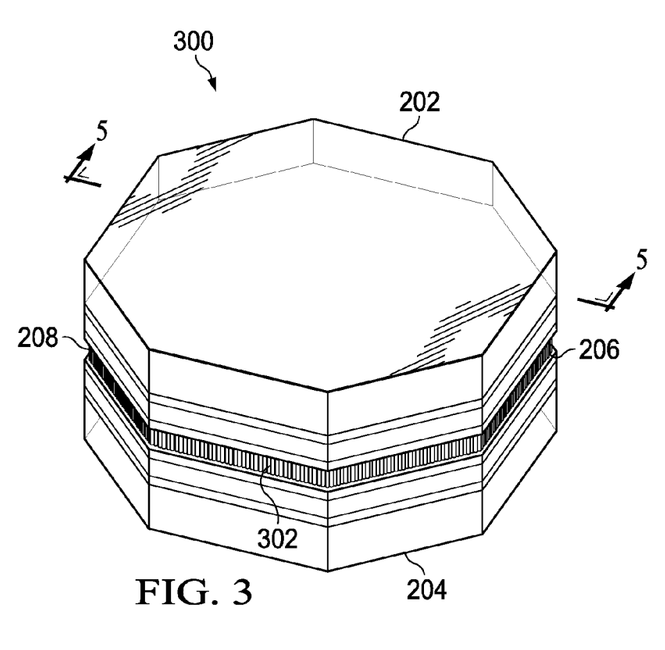
FIG. 3 is an illustration of a solar cell structure in accordance with an illustrative embodiment.

Turning next to FIG. 3, an illustration of a solar cell structure is depicted in accordance with an illustrative embodiment. As depicted, a perspective view of solar cell structure 300 is seen in this figure. In the illustrative example, solar cell structure 300 is an example of a physical implementation of solar cell structure 101 shown in block form in FIG. 1.

As depicted, solar cell structure 300 includes first wafer 202 and second wafer 204. As depicted, first wafer 202 and second wafer 204 are connected to each other using a connecting system. In the illustrative example, the connecting system includes first nanotubes 206 and second nanotubes 208 at interface 302 between first wafer 202 and second wafer 204.

Figure 4:
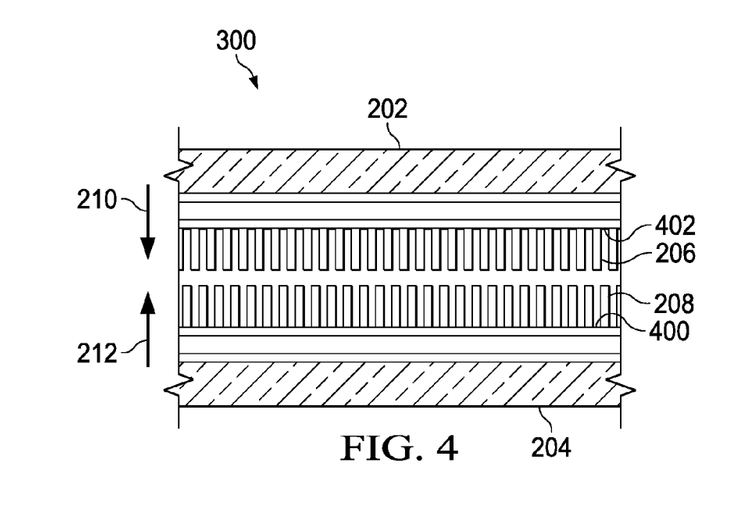
FIG. 4 is an illustration of a cross-sectional view of a portion of two wafers for a solar cell structure in accordance with an illustrative embodiment.

Next in FIG. 4, an illustration of a cross-sectional view of a portion of two wafers for a solar cell structure is depicted in accordance with an illustrative embodiment. As depicted, a portion of first wafer 202 and second wafer 204 are shown in a cross-sectional view taken along lines 4-4 in FIG. 2.

As can be seen in this cross-sectional view, first nanotubes 206 are positioned substantially perpendicular to first surface 400 of first wafer 202. Second nanotubes 208 are depicted as being substantially perpendicular to second surface 402 of second wafer 204. First nanotubes 206 and second nanotubes 208 are vertically aligned carbon nanotubes in this illustrative example.

Figure 5:
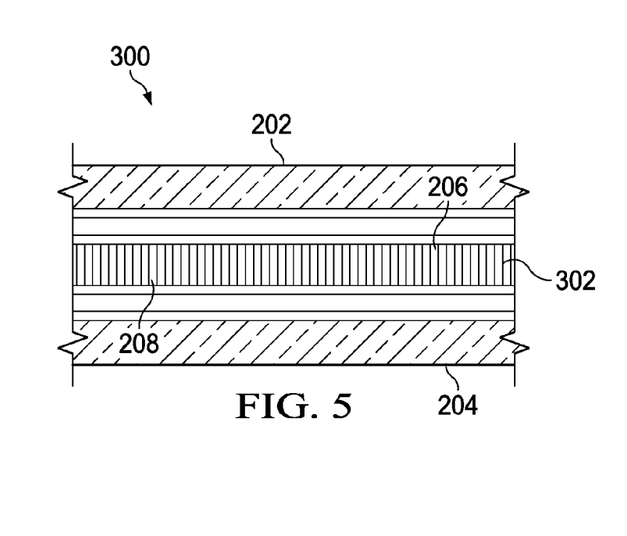
FIG. 5 is an illustration of a cross-sectional view of a solar cell structure in accordance with an illustrative embodiment.

With reference now to FIG. 5, an illustration of a cross-sectional view of a solar cell structure is depicted in accordance with an illustrative embodiment. In this illustrative example, a portion of solar cell structure 300 is shown in a cross-sectional view taken along lines 5-5 in FIG. 3. In this view, first nanotubes 206 and second nanotubes 208 are engaged with each other to form a connection at interface 302 between first wafer 202 and second wafer 204. In this illustrative example, the connection may be at least one of a bond based on van der Waals forces between first nanotubes 206 and second nanotubes 208 or a mechanical connection between first nanotubes 206 and second nanotubes 208.

Figure 6:
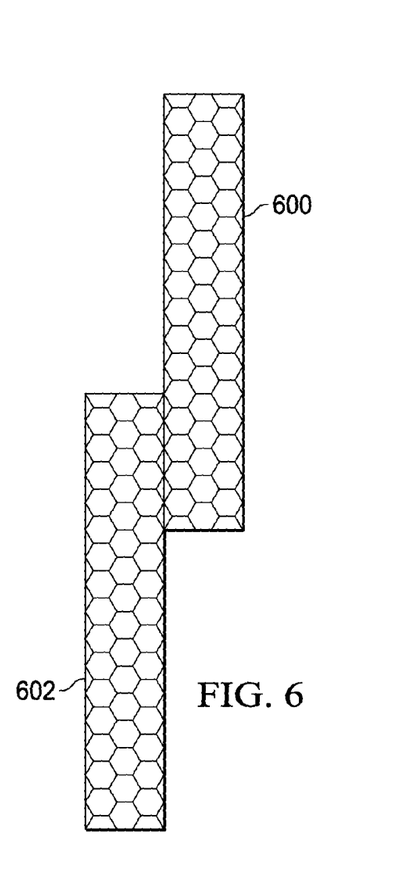
FIG. 6 is an illustration of nanotubes forming a bond by van der Waals forces in accordance with an illustrative embodiment.

Turning to FIG. 6, an illustration of nanotubes forming a bond by van der Waals forces is depicted in accordance with an illustrative embodiment. In this illustrative example, first nanotube 600 and second nanotube 602 are shown connected to each other by a bond. First nanotube 600 may be a nanotube in first nanotubes 206 on first wafer 202 in FIGS. 2-5. Second nanotube 602 may be a nanotube in second nanotubes 208 on second wafer 204 in FIGS. 2-5.

As depicted, the connection is made using a bond formed by van der Waals forces. In other words, an attractive force between molecules in first nanotube 600 and second nanotube 602 forms the bond between these two nanotubes.

Figure 7:
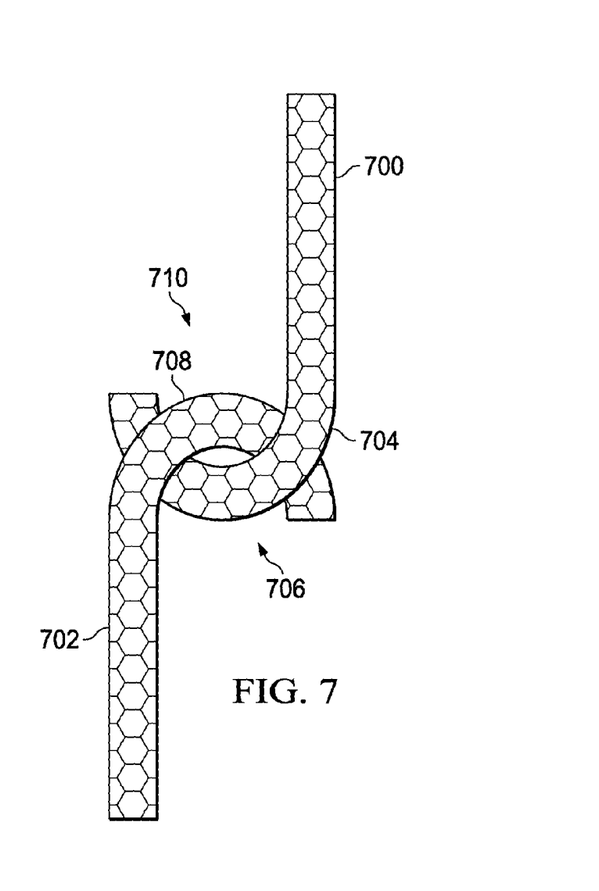
FIG. 7 is an illustration of nanotubes forming a bond with a mechanical connection in accordance with an illustrative embodiment.

Turning to FIG. 7, an illustration of nanotubes forming a bond with a mechanical connection is depicted in accordance with an illustrative embodiment. First nanotube 700 and second nanotube 702 are shown connected to each other by engagement features. First nanotube 700 may be a nanotube in first nanotubes 206 on first wafer 202 in FIGS. 2-5. Second nanotube 702 may be a nanotube in second nanotubes 208 on second wafer 204 in FIGS. 2-5.

As depicted, first nanotube 700 has first engagement feature 704 at end 706 of first nanotube 700. Second nanotube 702 has second engagement feature 708 at end 710 of second nanotube 702. In this illustrative example, first engagement feature 704 and second engagement feature 708 have hooked shapes that allow first nanotube 700 and second nanotube 702 to mechanically engage each other.

Figure 8:
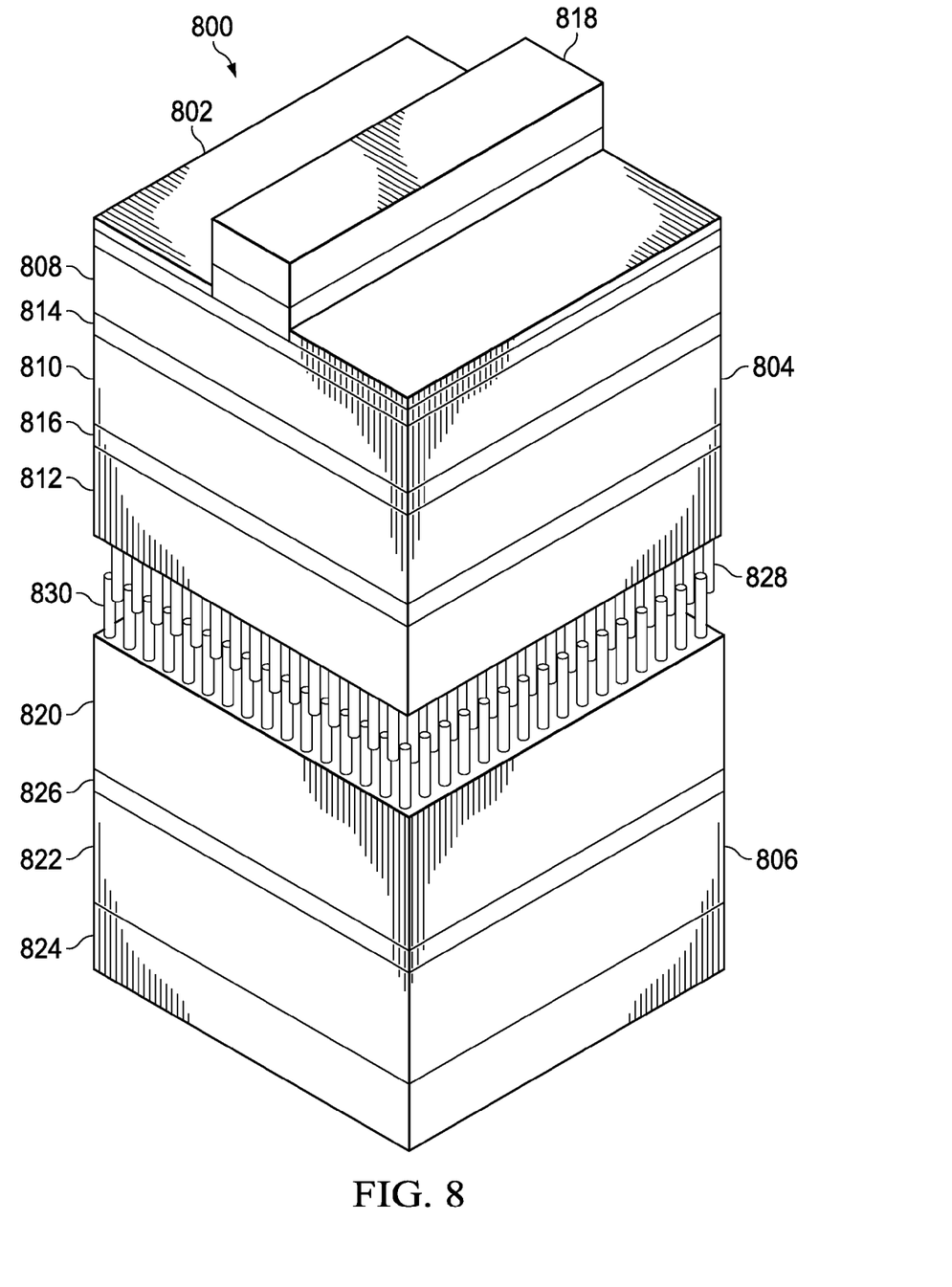
FIG. 8 is an illustration of a solar cell structure in accordance with an illustrative embodiment.

Turning now to FIG. 8, an illustration of a solar cell structure is depicted in accordance with an illustrative embodiment. In this depicted example, solar cell structure 800 takes the form of solar cell 802. As can be seen, solar cell 802 is comprised of first wafer 804 and second wafer 806.

In this illustrative example, first wafer 804 includes subcell 1 808, subcell 2 810 and subcell 3 812. Junction 814 is located between subcell 1 808 and subcell 2 810, and junction 816 is located between subcell 2 810 and subcell 3 812. Trace line 818 is located on subcell 1 808 in this illustrative example.

Second wafer 806 includes subcell 4 820 and subcell 5 822. Second wafer 806 also includes InP substrate 824. Junction 826 is located between subcell 4 820 and subcell 5 822.

Each subcell passes light of different wavelengths or ranges of wavelengths. The junctions generate electricity from light that reaches junctions through the subcells. Instead of using direct bonding between first wafer 804 and second wafer 806, the illustrative example employs first nanotubes 828 and second nanotubes 830 to connect first wafer 804 to second wafer 806.

Figure 9:
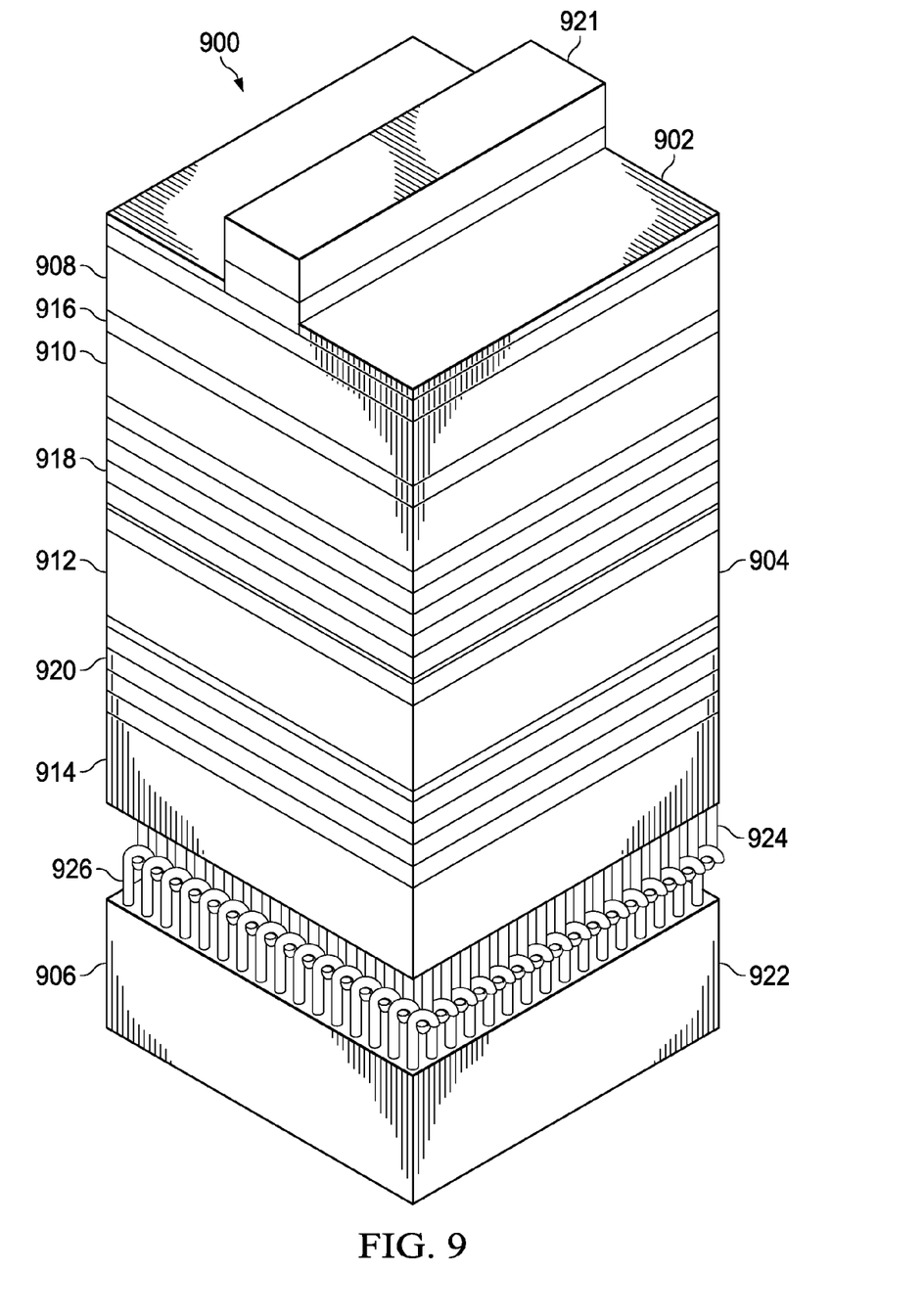
FIG. 9 is another illustration of a solar cell structure in accordance with an illustrative embodiment.

With reference next to FIG. 9, another illustration of a solar cell structure is depicted in accordance with an illustrative embodiment. In this depicted example, cell structure 900 takes the form of an inverted metamorphic multi-junction (IMM) solar cell 902. As depicted, solar cell 902 includes first wafer 904 and second wafer 906.

First wafer 904 includes subcell 1 908, subcell 2 910, subcell 3 912, and subcell 4 914. Junction 916 is located between subcell 1 908 and subcell 2 910. Graded metamorphic multi-junction (MM) layers 918 are located between subcell 2 910 and subcell 3 912, and graded metamorphic multi-junction (MM) layers 920 are located between subcell 3 912 and subcell 4 914. First wafer 904 also has trace line 921 formed on subcell 1 908.

In this illustrative example, second wafer 906 takes the form of handle 922. As depicted, handle 922 may be comprised of various materials such as silicon (Si), germanium (Ge), or some other suitable material. Handle 922 is the portion of inverted metamorphic multi-junction (IMM) solar cell 902 that is carried or handled. Electrical generating components or devices are not formed on this wafer.

As depicted, first nanotubes 924 on first wafer 904 may be connected to second nanotubes 926 on second wafer 906. This connection forms a connection between the wafers. In this example, transparency for transmitting light between first wafer 904 and second wafer 906 may not be necessary. With this type of application, an adhesive also may be used in addition to first nanotubes 924 and second nanotubes 926 between first wafer 904 and second wafer 906 to provide for increased bonding strength between the wafers.

The illustration of solar cell 802 in FIG. 8 and inverted metamorphic multi-junction (IMM) solar cell 902 in FIG. 9 are only provided as some example applications in which a connecting system may be used. The connecting system comprising nanotubes connecting wafers to each other may be used in other applications. These applications may include applications outside of solar cells. For example, other applications may include photodetectors and circuits on different wafers that may be connected to each other to form a sensor chip assembly for other applications in which it is desirable to connect wafers to each other.

The different components shown in FIGS. 2-9 may be combined with components in FIG. 1, used with components in FIG. 1, or a combination of the two. Additionally, some of the components in FIGS. 2-9 may be illustrative examples of how components shown in block form in FIG. 1 can be implemented as physical structures.

Figure 10:
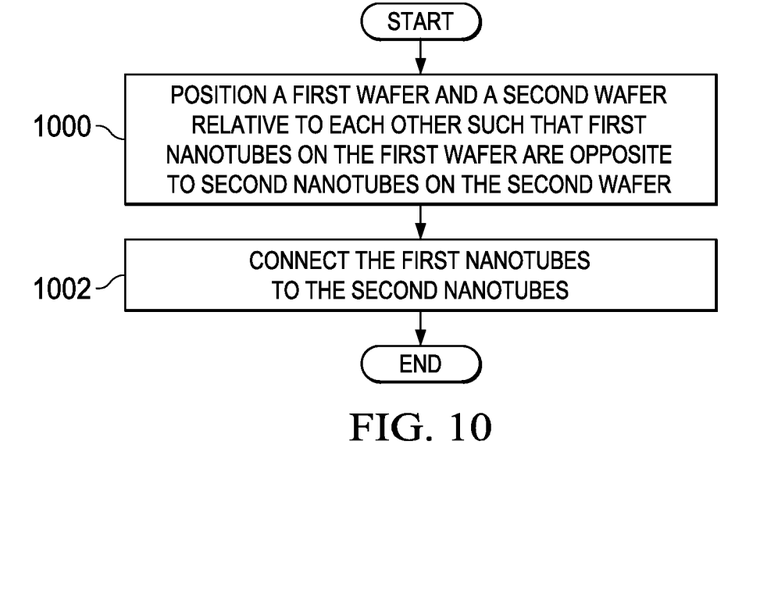
FIG. 10 is an illustration of a flowchart of a process for forming a solar cell structure in accordance with an illustrative embodiment.

Turning now to FIG. 10, an illustration of a flowchart of a process for forming a solar cell structure is depicted in accordance with an illustrative embodiment. The process illustrated in FIG. 10 may be implemented in solar cell structure fabrication environment 100 in FIG. 1. In particular, the process may be implemented in connection process 114 to connect wafers 104 to each other.

The process beings by positioning a first wafer and a second wafer relative to each other such that first nanotubes on the first wafer are opposite to second nanotubes on the second wafer (operation 1000). In other words, the surfaces on which the first nanotubes and second nanotubes are located are facing each other when the first wafer and the second wafer are positioned.

The process then connects the first nanotubes to the second nanotubes (operation 1002), with the process terminating thereafter. The first wafer connected to the second wafer forms a solar cell structure.

In operation 1002, a bond is formed by the first nanotubes and the second nanotubes that is based on van der Waals forces between the first nanotubes and the second nanotubes. The connection may also be formed as a mechanical connection between the first nanotubes and the second nanotubes. One or both of a bond and a mechanical connection may be formed.

Figure 11:
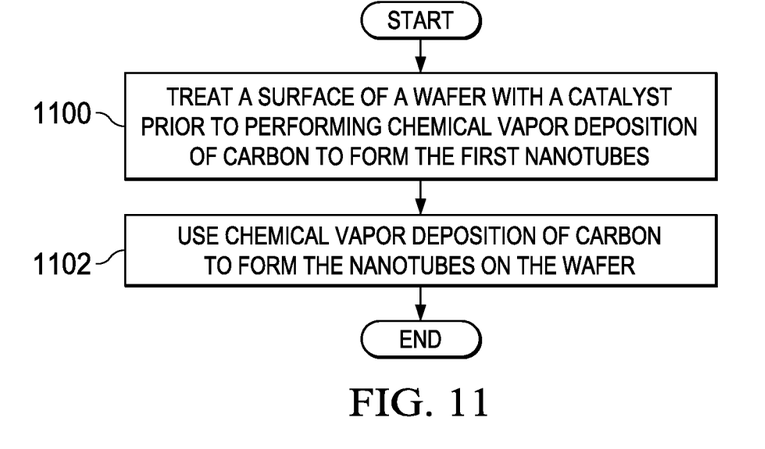
FIG. 11 is an illustration of a flowchart of a process for forming nanotubes on a wafer in accordance with an illustrative embodiment.

With reference next to FIG. 11, an illustration of a flowchart of a process for forming nanotubes on a wafer is depicted in accordance with an illustrative embodiment. The process illustrated in FIG. 11 may be implemented to form first nanotubes 122 on first wafer 116 and second nanotubes 126 on second wafer 118.

The process begins by treating a surface of a wafer with a catalyst prior to performing chemical vapor deposition of carbon to form the first nanotubes (operation 1100). The catalyst deposition in operation 1100, may be, for example, deposition of a nanoparticle solution on the wafer. Other examples of catalysts may include nanoparticles deposited by metal evaporation or metal sputtering. In yet other examples, the catalysts may include nanoparticles deposited by the evaporation of metal films with nanoscale grain sizes optimized for nanotube growth. The nanoparticle solution may be deposited using a spin coating process. In this example, the nanoparticle solution may be, for example, a nickel nanoparticle solution. Other examples of nanoparticle solutions may include a copper nanoparticle solution or an iron nanoparticle solution.

The process then uses chemical vapor deposition of carbon to form the nanotubes on the wafer (operation 1102), with the process terminating thereafter. In this operation, the wafer is exposed to a carbon containing gas. Operation 1102 may be performed using temperature changes over time that cause the ends to have a hooked shape.

Figure 12:
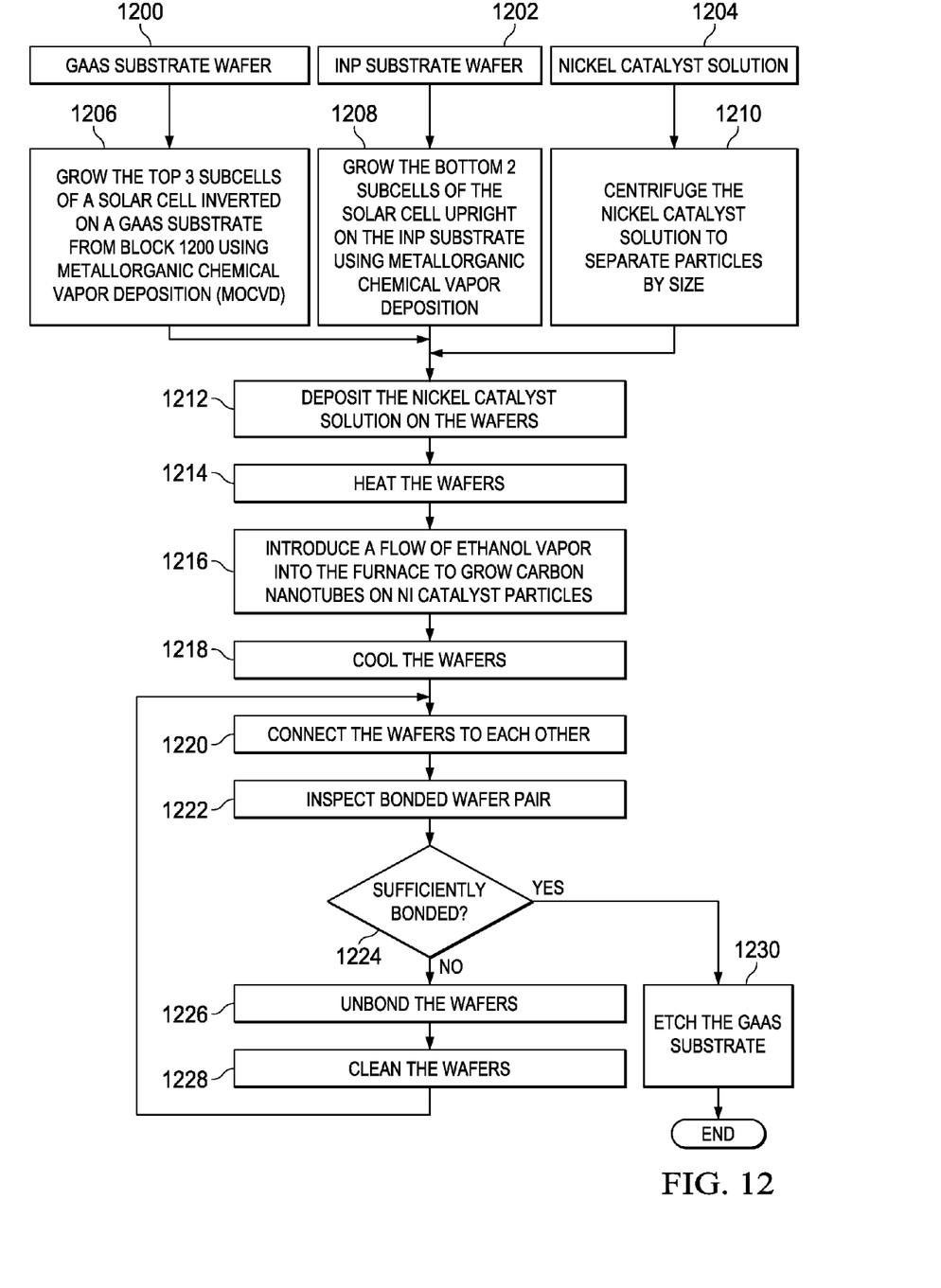
FIG. 12 is an illustration of a flowchart of a more detailed process for forming a solar cell structure in accordance with an illustrative embodiment.

Turning next to FIG. 12, an illustration of a flowchart of a more detailed process for forming a solar cell structure is depicted in accordance with an illustrative embodiment. The process illustrated in FIG. 12 may be used to form solar cell structure 800 as depicted in FIG. 8. The process illustrated in FIG. 11 may be implemented to form solar cell structure 101 in FIG. 1.

In this illustrative example, the process begins with a gallium arsenide (GaAs) substrate wafer in block 1200, indium phosphide (InP) substrate wafer in block 1202, and nickel (Ni) catalyst solution in block 1204. The nickel catalyst solution is 1 percent by weight. The nickel (Ni) catalyst solution is prepared by dilution of nickel nanoparticles in a solvent such as isopropanol. The nickel nanoparticles have a diameter of about 2 nanometers to about 50 nanometers. Other examples of nanoparticle solutions may include iron or nickel nanoparticles dissolved in a solvent such as isopropanol.

The process then grows the top 3 subcells of a solar cell inverted on a GaAs substrate from block 1200 using metallorganic chemical vapor deposition (MOCVD) (operation 1206). The process also grows the bottom 2 subcells of the solar cell upright on the InP substrate using metallorganic chemical vapor deposition (operation 1208). The process also centrifuges the nickel catalyst solution to separate particles by size (operation 1210). In operation 1210, the top portion of the solution containing nanoparticles having a diameter that is less than about 20 nanometers is separated from the remainder of the solution. Operation 1206, operation 1208, and operation 1210 may be performed at about the same time or at different times.

Next, the process deposits the nickel catalyst solution on the wafers (operation 1212). In operation 1212, the catalyst is deposited by spin coating the nickel catalyst solution and is deposited on the wafers from operation 1206 and operation 1202 using the catalyst solution as processed in operation 1210.

The process then heats the wafers (operation 1214). In operation 1214, the wafers may be wafers that are loaded into a chemical vapor deposition (CVD) furnace and heated to a growth temperature of about 600 degrees C. in an argon (Ar) gas. The process then introduces a flow of ethanol vapor into the furnace to grow carbon nanotubes on Ni catalyst particles (operation 1216). The flow of ethanol vapor is at a pressure of about 1 torr to about 10 torr for about 5 minutes to about 10 minutes to grow carbon nanotubes on the nickel catalyst particles in the nickel catalyst solution.

The process then cools the wafers (operation 1218). In operation 1218, the wafers are brought down to room temperature in Ar gas in the furnace and then removed from the furnace. The wafers are connected to each other (operation 1220). In this operation, the two wafers are aligned in a fixture and the two surfaces with the nanotubes are brought into contact with the aid of a weight. The contact forms a connection, which is a bond in the illustrative example.

The bonded wafer pair is inspected (operation 1222). The inspection is performed using infrared (IR) transmission imaging to ensure that the surfaces are sufficiently bonded. A determination is made as to whether the wafers a sufficiently bonded (operation 1224). The determination of whether wafers are sufficiently bonded may be made, for example, through the measurement of infrared transmission above a specified threshold across the wafer area or visible inspection of the infrared transmission image to verify an absence of trapped particles or bond voids as indicated by localized low transmission regions.

If the wafers are insufficiently bonded, the process unbonds the wafers (operation 1226). The wafers may be separated by the aid of a debonding shim. The wafers are cleaned (operation 1228), with the process then returning to operation 1220.

With reference again to operation 1224, if the wafers are sufficiently bonded, the process etches the GaAs substrate (operation 1230), with process terminating thereafter. The etching is performed to remove the GaAs substrate. At this time, the solar cell structure may be processed to form the solar cell.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

For example, an adhesive may be applied to at least one of the first wafer and the second wafer prior to connecting the first nanotubes to the second nanotubes. The adhesive may add additional strength to the connection in addition to the nanotubes. The adhesive is selected to have a level of transparency that passes a desired amount of light. The conductivity may be supplied by the connection between the first nanotubes and the second nanotubes.

As another example, the catalyst is shown as nickel. The catalyst also may be a metal catalyst selected from at least one of nickel, cobalt, iron, or some other suitable catalyst.

Thus, the illustrative embodiments provide a method and apparatus for connecting wafers. With the connection system in the different illustrative examples, wafers may be connected to each other more easily. The illustrative examples allow for a connection to be made at temperatures lower than currently used temperatures to bond wafers to each other to form solar structures.

Additionally, the wafers may be connected to each other to form solar structures with fewer inconsistencies. For example, the formation of cracks, delamination, or other undesired inconsistencies may be reduced. Additionally, with the use of nanotubes to form connections, the wafers may be disconnected from each other more easily than when direct bonding or adhesives are used. This ability to disconnect wafers may allow for rework or replacement of wafers in case an inconsistency is identified during manufacturing of a solar cell structure.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for forming a solar cell structure, the method comprising:
    positioning a first wafer and a second wafer relative to each other such that first nanotubes on the first wafer are opposite to second nanotubes on the second wafer; and
    connecting the first nanotubes to the second nanotubes, wherein the first wafer is connected to the second wafer to form the solar cell structure, wherein the first nanotubes extend in a direction substantially perpendicular to a first surface of the first wafer and the second nanotubes extend in a direction substantially perpendicular to a second surface of the second wafer.

2. The method of claim 1, wherein connecting the first nanotubes to the second nanotubes comprises:
    forming a bond based on van der Waals forces between the first nanotubes and the second nanotubes.

3. The method of claim 1, wherein connecting the first nanotubes to the second nanotubes comprises:
    forming a mechanical connection between the first nanotubes and the second nanotubes.

4. The method of claim 1 further comprising:
    applying an adhesive to at least one of the first wafer or the second wafer prior to connecting the first nanotubes to the second nanotubes.

5. The method of claim 1 further comprising:
    forming the first nanotubes on the first wafer; and
    forming the second nanotubes on the second wafer.

6. The method of claim 5, wherein the step of forming the first nanotubes comprises:
performing chemical vapor deposition of carbon to form the first nanotubes.

7. The method of claim 6, wherein performing the chemical vapor deposition of the carbon to form the first nanotubes comprises:
exposing the first wafer to a carbon containing gas.

8. The method of claim 6, wherein the step of forming the first nanotubes further comprises:
treating a surface of the first wafer with a catalyst prior to performing the chemical vapor deposition of the carbon to form the first nanotubes.

9. The method of claim 8, wherein the step of treating the surface of the first wafer with the catalyst comprises:
depositing a nanoparticle solution on the first wafer.

10. The method of claim 7, wherein a catalyst is a metal catalyst selected from at least one of nickel, cobalt, or iron.

11. The method of claim 1, wherein the first wafer has a group of subcells and the second wafer has at least one of a second group of subcells or a handle.

12. The method of claim 1, wherein the first wafer is selected from one of a similar wafer and a dissimilar wafer from the second wafer.

13. The method of claim 1, wherein the first nanotubes and the second nanotubes each have a diameter from about 2 nanometers to about 50 nanometers and a length from about 2 microns to about 10 microns.

14. A solar cell structure comprising:
a first wafer;
a second wafer;
first nanotubes formed on the first wafer; and
second nanotubes formed on the second wafer, wherein the first wafer and the second wafer are positioned relative to each other such that the first nanotubes are opposite the second nanotubes, and wherein the first nanotubes and the second nanotubes are connected to each other, and wherein the first nanotubes extend in a direction substantially perpendicular to a first surface of the first wafer and the second nanotubes extend in a direction substantially perpendicular to a second surface of the second wafer.

15. The solar cell structure of claim 14, wherein the first wafer has a group of subcells and the second wafer has at least one of a second group of subcells or a handle.

16. The solar cell structure of claim 14, wherein the first wafer is selected from one of a similar wafer and a dissimilar wafer from the second wafer.

17. The solar cell structure of claim 14, wherein the first nanotubes and the second nanotubes each have a diameter from about 2 nanometers to about 50 nanometers and a length from about 2 microns to about 10 microns.

18. A method for forming a structure, the method comprising:
positioning a first wafer and a second wafer relative to each other such that first nanotubes on the first wafer are opposite to second nanotubes on the second wafer; and
connecting the first nanotubes to the second nanotubes, wherein the first wafer is connected to the second wafer to form the structure, wherein connecting is performed by forming a bond based on van der Waals forces between the first nanotubes and the second nanotubes.

* * * * *